(12) United States Patent
Das et al.

(10) Patent No.: US 11,658,658 B2
(45) Date of Patent: May 23, 2023

(54) HIGH-VOLTAGE SWITCHES (71) Applicant: TEXAS INSTRUMENTS INCORPORATED, Dallas, TX (US)

(72) Inventors: Abhijit Kumar Das, Plano, TX (US); Brian Roger Elies, Dallas, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 17/700,230

(22) Filed: Mar. 21, 2022

(65) Prior Publication Data
US 2023/0106439 A1 Apr. 6, 2023

Related U.S. Application Data

(60) Provisional application No. 63/251,724, filed on Oct. 4, 2021.

(51) Int. Cl.
*H03K 17/687* (2006.01)
(52) U.S. Cl.
CPC .............................. *H03K 17/6871* (2013.01)
(58) Field of Classification Search
CPC ................................................ H03K 17/6871
See application file for complete search history.

(56) References Cited

U.S. PATENT DOCUMENTS

2014/0084988 A1* 3/2014 Mishra ............. H03K 17/04123
327/437

OTHER PUBLICATIONS

Razavi, Behzad, "The Bootstrapped Switch," A Circuit For All Seasons, IEEE Solid-State Circuits Magazine, Sep. 15, 2015, pp. 12-15.

* cited by examiner

*Primary Examiner* — Metasebia T Retebo
(74) *Attorney, Agent, or Firm* — Michael T. Gabrik; Frank D. Cimino (57) ABSTRACT

In some examples, a switch comprises first and second drain-extended transistors of a first type, third and fourth drain-extended transistors of a second type, a switch input coupled between drains of the first and third drain-extended transistors, a switch output coupled between drains of the second and fourth drain-extended transistors, and a control input. The control input is coupled to gates of the first and second drain-extended transistors, a first switch coupled to sources of the first and second drain-extended transistors, a second switch coupled between a voltage supply and gates of the third and fourth drain-extended transistors, and a third switch coupled between the voltage supply and sources of the third and fourth drain-extended transistors. The control input comprises a fifth drain-extended transistor coupled between the sources of the third and fourth drain-extended transistors and the gates of the third and fourth drain-extended transistors.

20 Claims, 9 Drawing Sheets

HIGH-VOLTAGE SWITCHES

CROSS-REFERENCE TO RELATED APPLICATIONS

The present application claims priority to U.S. Provisional Patent Application No. 63/251,724, which was filed Oct. 4, 2021, is titled "3V INPUT SWITCHING CIRCUIT USING 1.8V DEVICES," and is hereby incorporated herein by reference in its entirety.

BACKGROUND

Over the past several decades, semiconductor manufacturing technology has evolved to produce consistent decreases in semiconductor device size. In 1971, the 10 micron semiconductor process technology was prevalent (the 10 micron measurement referring to the average half-pitch of a memory cell produced using that process technology). By 1990, a 600 nanometer process technology was achieved, and by 2020, a 5 nanometer process technology had been achieved.

SUMMARY

In some examples, a switch comprises first and second drain-extended transistors of a first type, third and fourth drain-extended transistors of a second type, a switch input coupled between drains of the first and third drain-extended transistors, a switch output coupled between drains of the second and fourth drain-extended transistors, and a control input. The control input is coupled to gates of the first and second drain-extended transistors, a first switch coupled to sources of the first and second drain-extended transistors, a second switch coupled between a voltage supply and gates of the third and fourth drain-extended transistors, and a third switch coupled between the voltage supply and sources of the third and fourth drain-extended transistors. The control input comprises a fifth drain-extended transistor coupled between the sources of the third and fourth drain-extended transistors and the gates of the third and fourth drain-extended transistors.

BRIEF DESCRIPTION OF THE DRAWINGS

For a detailed description of various examples, reference will now be made to the accompanying drawings in which.

DETAILED DESCRIPTION

Due to a combination of technological, business, and practical factors, as semiconductor device dimensions decrease in size, they are increasingly limited in the voltages they can support. For example, the 45 nm process in some instances is able to support a maximum of 1.8 V, meaning that a component (e.g., a transistor) within a circuit manufactured using the 45 nm process is likely to encounter reliability problems if voltages across the component (e.g., across a gate oxide) are in excess of 1.8 V.

Some devices manufactured using relatively small process technologies (e.g., 45 nm) contain other components that require relatively high voltages. For example, a 45 nm process device capable of supporting 1.8 V may include a processor that requires switches capable of supporting relatively high 3.3 V inputs and outputs. Existing devices that include such switches are often unreliable because the relatively high voltages (e.g., 3.3 V) present at the switch inputs and outputs are carried to other nodes in the device where such high voltages are unsuitable. In some cases, the circuit design may be such that the high voltages are boosted even further (e.g., by a voltage supply rail) into the range of 5 V or higher, and these boosted voltages are applied to nodes in the device where they can cause significant damage and reliability problems.

Accordingly, this disclosure describes a switch that can accommodate high-voltage inputs and outputs without damaging or rendering unreliable the switch itself or other components in small, low-voltage process technology devices. The switch includes a pair of n-type drain-extended transistors and a pair of p-type drain-extended transistors. A drain-extended transistor is a transistor that has an implant in the drain allowing a large voltage drop across the drain boundary. Relative to other transistors, drain-extended transistor devices can handle much higher voltages across drain-to-gate, drain-to-bulk, and drain-to-source (although, without further modification, they may be held to the same process limitation of, for example, 1.8V across gate-to-source, gate-to-bulk, or source-to-bulk). The drains of the drain-extended transistors are coupled to the switch input and output so they can withstand high input and output voltages without reliability problems.

The switch includes a control input that turns the switch on and off. When the switch is off, the pairs of n-type and p-type drain-extended transistors are off and do not provide a pathway between the switch input and output. When the switch is on, the pairs of n-type and p-type drain-extended transistors provide pathways between the switch input and output, depending on the voltage provided at the switch input. For a first input voltage range, the pair of n-type drain-extended transistors provides a pathway from the switch input to the switch output. For a second input voltage range, the pair of p-type drain-extended transistors provides a pathway from the switch input to the switch output.

The n-type drain-extended transistors are controlled to be on and off using the control input and the input voltage provided at the switch input. Conversely, the p-type drain-extended transistors are controlled to be on and off using the input voltage provided at the switch input and circuitry within the switch that maintains a voltage at the p-type transistor gates that is adequately low relative to the sources of the p-type transistor gates so the p-type transistor gates are turned on. Various examples of the switch and systems implementing the switch are now described with reference to the drawings. As described below, the architecture of the switch precludes transistors within the switch from receiving a voltage across any two transistor terminals (e.g., gate to source, gate to drain, gate to bulk, source to drain, source to bulk, drain to bulk) that exceeds voltage levels appropriate for the process technology used (e.g., 1.8 V for 45 nm process technology), except for drains in drain-extended transistors (e.g., extended drain to source, extended drain to gate, extended drain to bulk), which may withstand high voltages (e.g., 3.3 V in 45 nm process technology). In this manner, the switch is capable of receiving and providing relatively high voltages in relatively small process technologies while mitigating the reliability challenges described above.

Figure 1:
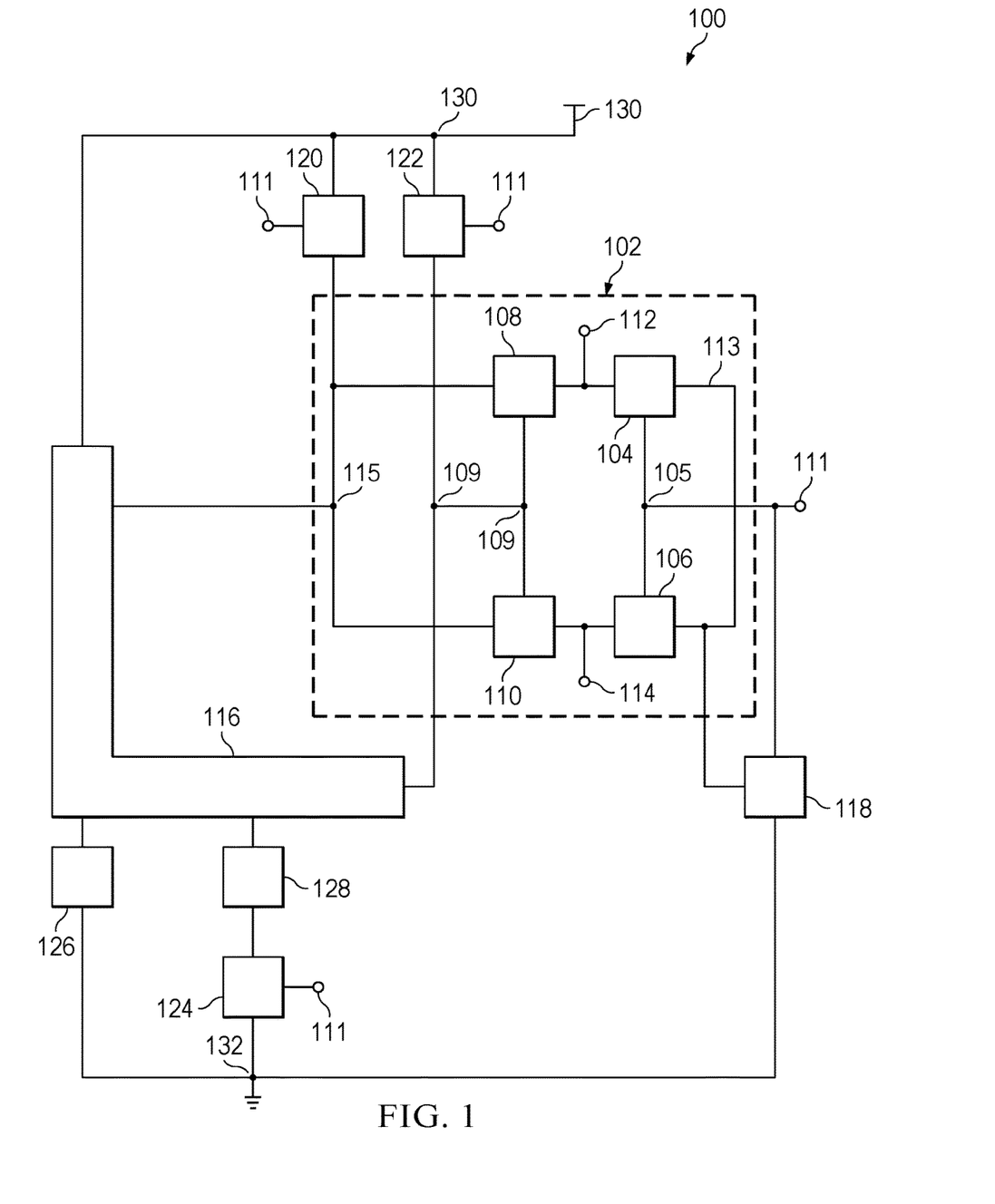
FIG. 1 is a conceptual block diagram of a switch, in accordance with various examples.

FIG. 1 is a conceptual block diagram of a switch 100, in accordance with various examples. The switch 100 may be implemented in any suitable circuit, such as an analog circuit (e.g., analog signal chain) in a system-on-chip (SOC). The switch 100 may be a relatively high voltage switch (e.g., capable of receiving and providing 3 V or more) implemented in a circuit, device, or system manufactured using a relatively small process technology, such as 45 nm, that uses relatively low maximum voltage levels (e.g., 1.8 V). The switch 100 mitigates the reliability challenges described above by not providing inappropriately high voltages to the various nodes of the switch 100. For example, the switch 100 may include drain-extended transistors that are capable of withstanding relatively high voltages from drain to source, drain to gate, and drain to bulk, and thus the switch 100 may enable drains of such drain-extended transistors to encounter such high voltages. Conversely, the switch 100 may avoid applying such high voltages from, e.g., gate to source, gate to bulk, or source to bulk, as well as drain to source, drain to gate, and drain to bulk in non-drain extended transistors.

In examples, the switch 100 includes a switching circuit 102, which, in turn, includes transistors 104, 106, 108, and 110. Various components of the switch 100, such as the transistors 104, 106, 108, and 110, are shown as blocks to indicate that those components may be of any suitable type, size, arrangement, etc. For example, the transistor 104 may be a field effect transistor (FET) or other type of transistor, be an n-type or p-type FET, have any of a variety of sizes and connections to adjacent circuitry, etc. In examples, the transistors 104 and 106 are of the same type (e.g., both are n-type FETs), and the transistors 108 and 110 are of the same type (e.g., both are p-type FETs). In examples, the transistors 104, 106, 108, and 110 are drain-extended transistors, with the drains of the transistors 104 and 108 directly coupled to a switch input 112, and with the drains of the transistors 106 and 110 directly coupled to a switch output 114.

The switch 100 receives input voltages on the switch input 112 and provides output voltages on the switch output 114. Because the transistors 104 and 108 have extended drains coupled directly to the switch input 112, relatively high input voltages do not damage or render unreliable the transistors 104 and 108. Similarly, because the transistors 106 and 110 have extended drains coupled directly to the switch output 114, relatively high output voltages do not damage or render unreliable the transistors 106 and 110. The switch output and inputs are interchangeable.

The transistors 104 and 106 are coupled to each other by way of a node 105. For example, the node 105 is coupled to gates of the transistors 104 and 106. The transistors 108 and 110 are coupled to each other by way of a node 109. For example, the node 109 is coupled to gates of the transistors 108 and 110. The transistors 104 and 106 (e.g., sources of the transistors 104 and 106) may also be coupled to each other by way of node 113, and the transistors 108 and 110 (e.g., sources of the transistors 108 and 110) may be coupled to each other by way of node 115.

The switching circuit 102 operates to regulate the provision of the input voltage on switch input 112 to the switch output 114. For example, if the switch 100 is controlled to be in an off state (as described below), the transistors of the switching circuit 102 are all off (e.g., in cutoff mode), and thus the input voltage on switch input 112 has no pathway to the switch output 114. Thus, the switch 100 is off. Similarly, for example, if the switch 100 is controlled to be in an on state (as described below), the transistors of the switching circuit 102 are selectively controlled to be on (e.g., in a linear or saturation mode), and thus the input voltage on switch input 112 has a pathway to the switch output 114. The transistors in the switching circuit 102 are controlled in part by the input voltage on the switch input 112, and thus the pairs of transistors that are on and that are off also depend on the input voltage on the switch input 112. When the switch 100 is in an on state, depending on the voltage level at switch input 112, the pair of transistors 104, 106 may be on while the pair of transistors 108, 110 is off, or the pair of transistors 104, 106 may be off while the pair of transistors 108, 110 is on, or all of the transistors 108, 110, 104 and 106 may be on. In some examples, the pair of transistors 104, 106 is on and the pair of transistors 108, 110 is off when the input voltage on the switch input 112 is in a first range (e.g., 0 V to 1.2 V), and the pair of transistors 104, 106 is off and the pair of transistors 108, 110 is on when the input voltage on the switch input 112 is in a second range (e.g., 1.2 V to 3.3 V). In some examples, there may be an overlap between the two ranges, such as in the range 0.8 V to 1.2 V, where both pairs of transistors are on. These ranges may be controlled at least in part by selecting transistors with specific threshold voltages. When the switch 100 is in the on state, for proper functionality of the switch 100, the voltage drop across the drain-to-source of the transistors 108 and 110, across the drain-to-source of the transistors 104 and 106, or across the drain-to-source of all of these transistors must be very small. This enforces a constraint on the voltage requirement in the gate node of the devices (e.g., nodes 109 and 105). To ensure proper device reliability, the voltage difference between nodes 109 and 115 and nodes 105 and 113 is maintained below the process limit of 1.8V, even when the voltages on switch inputs/outputs 112, 114 and nodes 113, 115 can be higher than 1.8V. Because the channel formed in a transistor, such as a FET, depends on the voltage across particular terminals of the transistor (e.g., gate and source), the input voltage at the switch input 112 is not the sole determinant of the range in which the two different pairs of transistors are turned on or off. In particular, the voltages at the gates of the transistors in the switching circuit 102, in tandem with the voltages at the sources of these transistors, determine the gate to source voltages across the transistors and, thus, whether the transistors are turned on or turned off. When the switch 100 is on, the gate voltages of the transistors 104 and 106 are determined by a control input 111, and the gate voltages of the transistors 108 and 110 are maintained at a fixed level below the source voltages of the transistors 108 and 110 by circuitry 116. Specifically, the circuitry 116 maintains the voltage provided at node 109 on the gates of the transistors 108 and 110 a predefined amount lower than the voltages at the sources of the transistors 108 and 110, thereby keeping the transistors 108 and 110 turned on until the voltage at the sources of the transistors 108 and 110 drops so low that the voltage provided by the circuitry 116 on node 109 is at ground. The node 109 saturates at ground, thereby defining the lowest source voltage that will cause transistors 108 and 110 to be on. The circuitry 116 may be adjusted such that the voltage that the circuitry 116 provides at node 109 is not so low relative to the voltage on the sources of the transistors 108, 110 that the gate to source voltage is inappropriately high and causes the reliability problems described above.

The switch 100 also includes switches (e.g., transistors) 118, 120, 122, and 124. These switches are controlled by a control signal at control input 111. When the control signal at control input 111 is in a first state, the switches 118, 120, and 122 open and the switch 124 closes. Conversely, when the control signal at control input 111 is in a second state, the switches 118, 120, and 122 close and the switch 124 opens. Closing the switches 118, 120, and 122 and opening the switch 124 causes the switch 100 to be in an off state, because the closed switches 120, 122 cause a high voltage from a voltage supply 130 to be provided to both the gates and sources of the transistors 108, 110, thereby keeping the transistors 108, 110 off and denying the input voltage on the switch input 112 a pathway to the switch output 114. In addition, because the gates and sources of the transistors 108, 110 are pulled up to approximately the same voltages, the gate to source voltage across each of the transistors 108, 110 is kept low enough to mitigate any reliability problems that could otherwise arise. Further, when the switch 118 is closed, the gates and sources of the transistors 104, 106 are pulled low to ground 132, thereby turning off the transistors 104, 106 and denying the input voltage on the switch input 112 a pathway to the switch output 114. Because the input voltage on the switch input 112 has no pathway to the switch output 114, the switch 100 is off. In this scenario, the state of the switch 124 is not relevant to whether the switch 100 is on or off.

When the control signal on control input 111 is in such a state that the switches 118, 120, and 122 are open, the input voltage on switch input 112, the voltage of the control signal applied to node 105, and the voltage provided by circuitry 116 to node 109 together control the operation of the transistors in the switching circuit 102, as described above. Further, the switch 124 is closed, enabling bias current source 128 to provide current through the circuitry 116, which, in turn, enables circuitry 116 to step down the input voltage from switch input 112 to a target voltage on node 109. Accordingly, when the control signal on control input 111 causes the switches 118, 120, and 122 to open and switch 124 to close, the switch 100 is on.

The switch 100 also includes a bias current source 126 coupled to the circuitry 116. The bias current source 126 maintains a constant flow of current through a transistor in the circuitry 116, thereby maintaining a channel in that transistor and keeping it on. By keeping that transistor on, the transistor is protected from relatively high voltages from gate to bulk that may cause damage or reliability challenges. The circuitry 116 may include additional components as described below.

Figure 2:
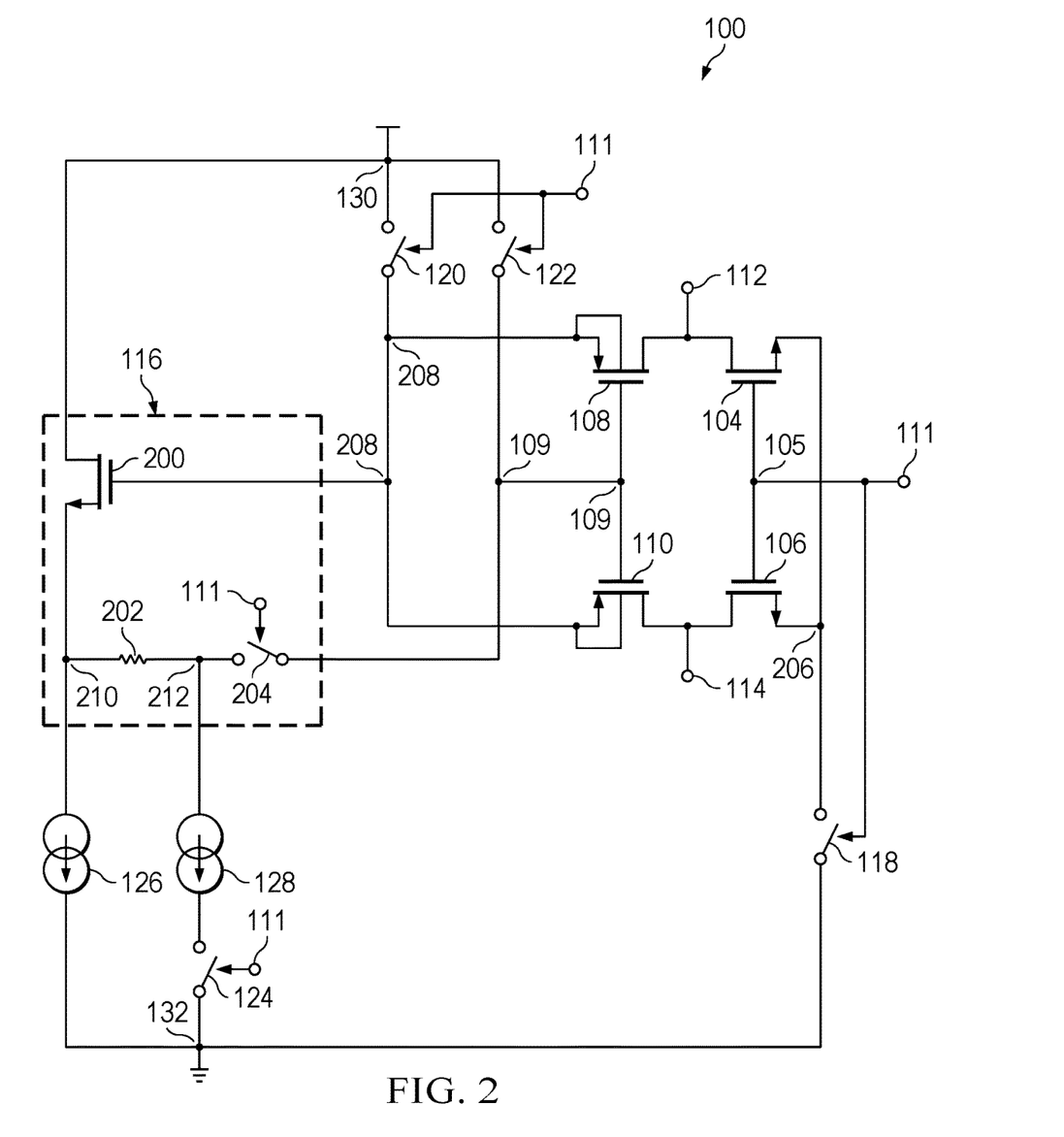
FIG. 2 is a schematic circuit diagram of a switch, in accordance with various examples.
Figure 4:
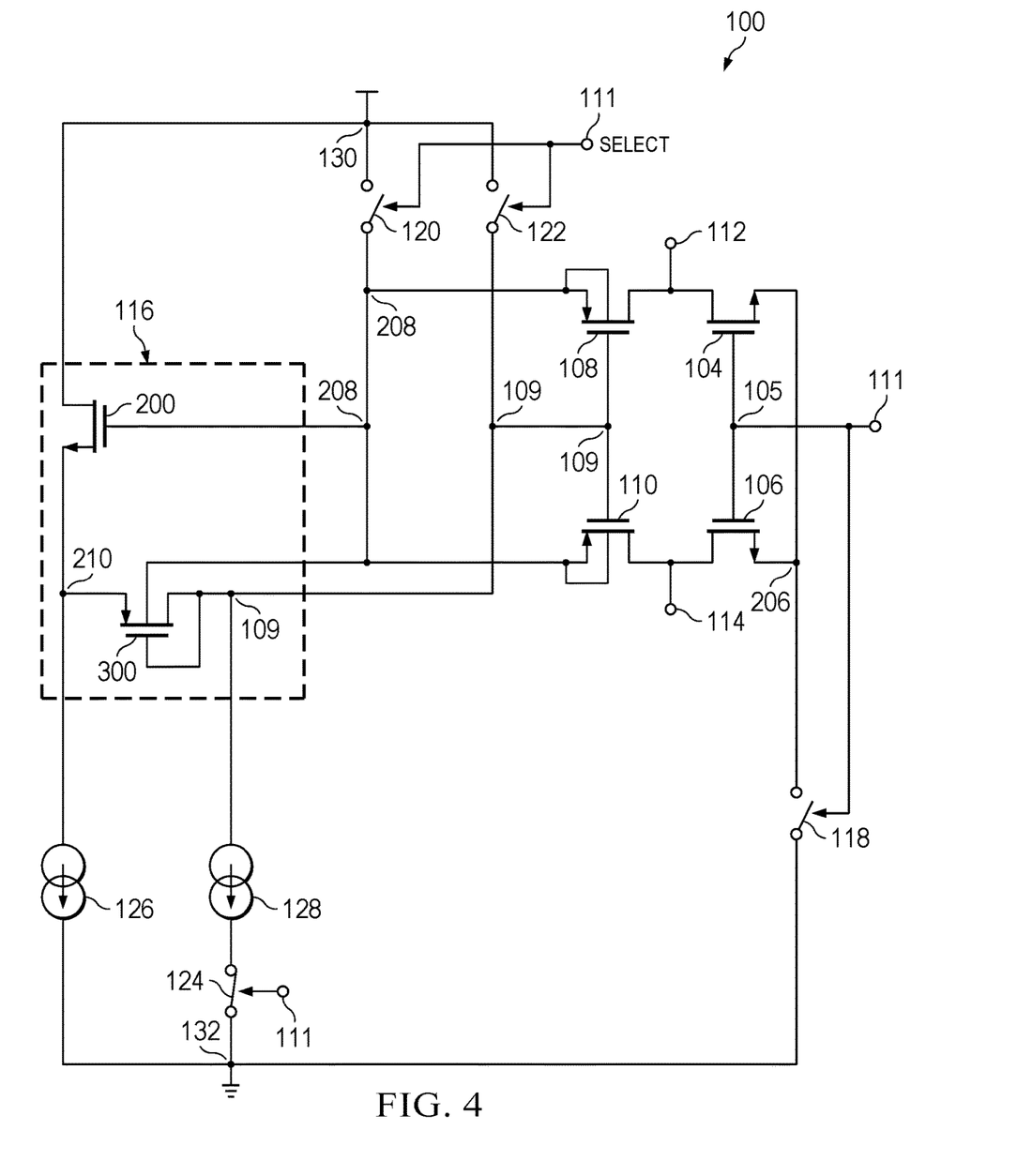
FIG. 4 is a schematic circuit diagram of a switch in an on state, in accordance with various examples.

FIG. 2 is a schematic circuit diagram of the switch 100, in accordance with various examples. The switch 100 is not limited in scope to the example of FIG. 2. FIG. 4 is a simplified view of the circuit diagram of FIG. 2 with certain open switches illustrated as open circuits and certain closed switches illustrated as closed circuits. FIGS. 2 and 4 are thus described in parallel. The example switch 100 of FIG. 2 includes drain-extended transistors 104, 106, 108, 110, and 200. The pair of transistors 104 and 106 are n-type FETs, and the pair of transistors 108 and 110 are p-type FETs. The drains of the transistors 104 and 108 are coupled to the switch input 112. The drains of the transistors 106 and 110 are coupled to the switch output 114. The gates of the transistors 104 and 106 are coupled to each other at node 105, and the gates of the transistors 108 and 110 are coupled to each other at node 109. Control input 111 is coupled to node 105 and to switch 118 as a control for switch 118. Switch 118 is coupled between node 206 and ground 132.

The bulk and source of the transistor 108 are coupled together. The bulk and source of the transistor 110 are coupled together. These bulk connections are established because p-type FETs (e.g., transistors 108, 110) have parasitic diodes between the source and bulk terminals and between the drain and bulk terminals. To ensure that no current flows through these diodes, the bulk voltage must be greater than or equal to the source and drain voltages. By connecting the bulk and source terminals, the bulk and source terminal voltages are made equal, and because the source voltage is always greater than or equal to the drain voltage, the bulk voltage is likewise greater than or equal to the drain voltage. The sources of the transistors 108, 110 are coupled to node 208. Node 208 is coupled to switch 120, which, in turn, is coupled to voltage supply 130. Node 109 is coupled to switch 122, which, in turn, is coupled to voltage supply 130. The switches 120 and 122 are coupled to and controlled by control input 111.

An example circuitry 116 includes a drain-extended transistor 200 (e.g., an n-type FET). A gate of the transistor 200 is coupled to node 208. A drain of the transistor 200 is coupled to the voltage supply 130. A source of the transistor 200 is coupled to a node 210. The node 210 is coupled to a resistor 202, which is coupled to a node 212. A switch 204 is coupled between the node 212 and node 109, and the switch 204 is controlled by control input 111. Node 212 is coupled to a bias current source 128 (e.g., 20 micro amps), and the bias current source 128 is coupled to the switch 124. The control input 111 controls the switch 124. The switch 124 is coupled to the ground 132. The bias current source 126 (e.g., 2.5 micro amps) is coupled to the node 210 and to ground 132.

In operation, when the control input 111 is driven low, the switch 100 is off, because the switches 118, 120, and 122 are closed. Closing the switches 120, 122 pulls up nodes 109 and 208, which results in the gates and sources of the transistors 108, 110 having approximately equal voltages. Consequently, the gate to source voltage across each of the transistors 108, 110 is approximately zero, and, in any event, inadequate to turn on the transistors 108, 110. Thus, the input voltage on the switch input 112 is unable to reach the switch output 114 by way of the transistors 108, 110. Furthermore, when the control input 111 is driven low, the switch 118 is closed and node 206 is pulled to ground 132. Pulling node 206 to ground 132 results in the sources of transistors 104, 106 being pulled to ground 132. Furthermore, when the control input 111 is driven low, the node 105 and gates of the transistors 104, 106 are also low. Thus, the gate to source voltage on each of the transistors 104, 106 is inadequate to turn on the transistors 104, 106. Consequently, the input voltage on switch input 112 does not have a path to the switch output 114 by way of the transistors 104, 106. The switch 100 is thus considered to be off.

When the control input 111 is driven high, the switch 100 is on, and the switches 118, 120, and 122 are open. Consequently, node 206 is not coupled to ground 132, node 109 is not coupled to voltage supply 130, and node 208 is not coupled to voltage supply 130. As a result, the voltages on nodes 206 and 208 are determined by the input voltage on switch input 112. The voltage on node 206 is equal to the lesser of the voltage on switch input 112 and the voltage on node 105, minus the threshold voltage of transistor 104, and the voltage on node 208 is equal to the greater of the voltage on switch input 112 and the absolute value of the threshold voltage of transistor 108. The voltage on the gate of transistor 104 is the voltage on control input 111 (e.g., 1.8 V), and the voltage on the source of transistor 104 is the input voltage on switch input 112. So long as the input voltage on switch input 112 is low enough that the gate to source voltage across transistor 104 is greater than the threshold voltage of transistor 104, transistor 104 is on. The same rationale applies to transistor 106. Thus, there is an input voltage range over which the transistors 104 and 106 are on. In some examples, this range is approximately 0 V to 1.2 V, as 1.8 V on node 105 minus a threshold voltage of 0.6 V is 1.2 V. Other voltage ranges are contemplated and included in the scope of this disclosure.

Continuing with the examples in which the input voltage range over which the pair of transistors 104, 106 are on is 0 V to 1.2 V, the transistors 104 and 106 are unable to stay on for input voltages above this input voltage range. Consequently, the transistors 104 and 106 do not provide a pathway between the switch input 112 and switch output 114 above this input voltage range. The transistors 108 and 110 are useful to provide a pathway between the switch input 112 and switch output 114 for input voltages above the range of 0 V to 1.2 V. To turn on the transistors 108 and 110, an appropriate gate to source voltage should be present across the transistors 108 and 110. If the transistors 108 and 110 are p-type FETs, the source voltage should exceed the gate voltage by the threshold voltage of the transistors 108 and 110. To achieve such a gate to source voltage, the circuitry 116—and more specifically, the transistor 200 and resistor 202—steps down the voltages present at the sources of the transistors 108, 110 (e.g., on node 208) and provides the stepped-down voltage to the gates of the transistors 108, 110 on node 109. In an example, the transistor 200 reduces the input voltage on node 208 by a threshold voltage of the transistor 200, and the resistor 202 reduces the voltage provided by the transistor 200 (e.g., by the product of the current flowing through the resistor 202 and the resistance of the resistor 202) to produce the voltage that is applied to the gates of the transistors 108, 110 on node 109. In this manner, the circuitry 116 keeps the transistors 108, 110 on regardless of how high the input voltage on switch input 112 goes. However, the voltage on node 109 saturates at ground, meaning that the voltage on node 109 does not drop below 0 V. Thus, the lowest input voltage at which the circuitry 116 can keep the transistors 108, 110 on is 0 V plus the voltage drop across the resistor 202 plus the threshold voltage of the transistor 200. In examples, the input voltage range over which the transistors 108, 110 remain on is from approximately 1.1 V to 3.3 V, although the range may vary depending on the current flowing through the resistor 202, the resistance of the resistor 202, the threshold voltage of the transistor 200, and potentially other factors, such as additional circuitry that may be included in the circuitry 116.

When the switch is on as described above, the switches 124 and 204—unlike the switches 118, 120, and 122—are closed. Closing the switch 204 provides a pathway for the voltage formed by the circuitry 116 to be provided to the node 109. Closing the switch 124 causes the bias current source 128 to be introduced into the circuit. The current provided by the bias current source 128 flows through the resistor 202 and affects the voltage drop across the resistor 202, and, hence, the voltage applied on node 109 to control the transistors 108, 110. As described above, the bias current source 126 (e.g., 2.5 micro amps) maintains a channel in the transistor 200 regardless of the gate to source voltage across the transistor 200, thereby maintaining the integrity of the transistor 200 when high voltages are applied to the transistor 200 (e.g., gate to bulk).

Figure 3:
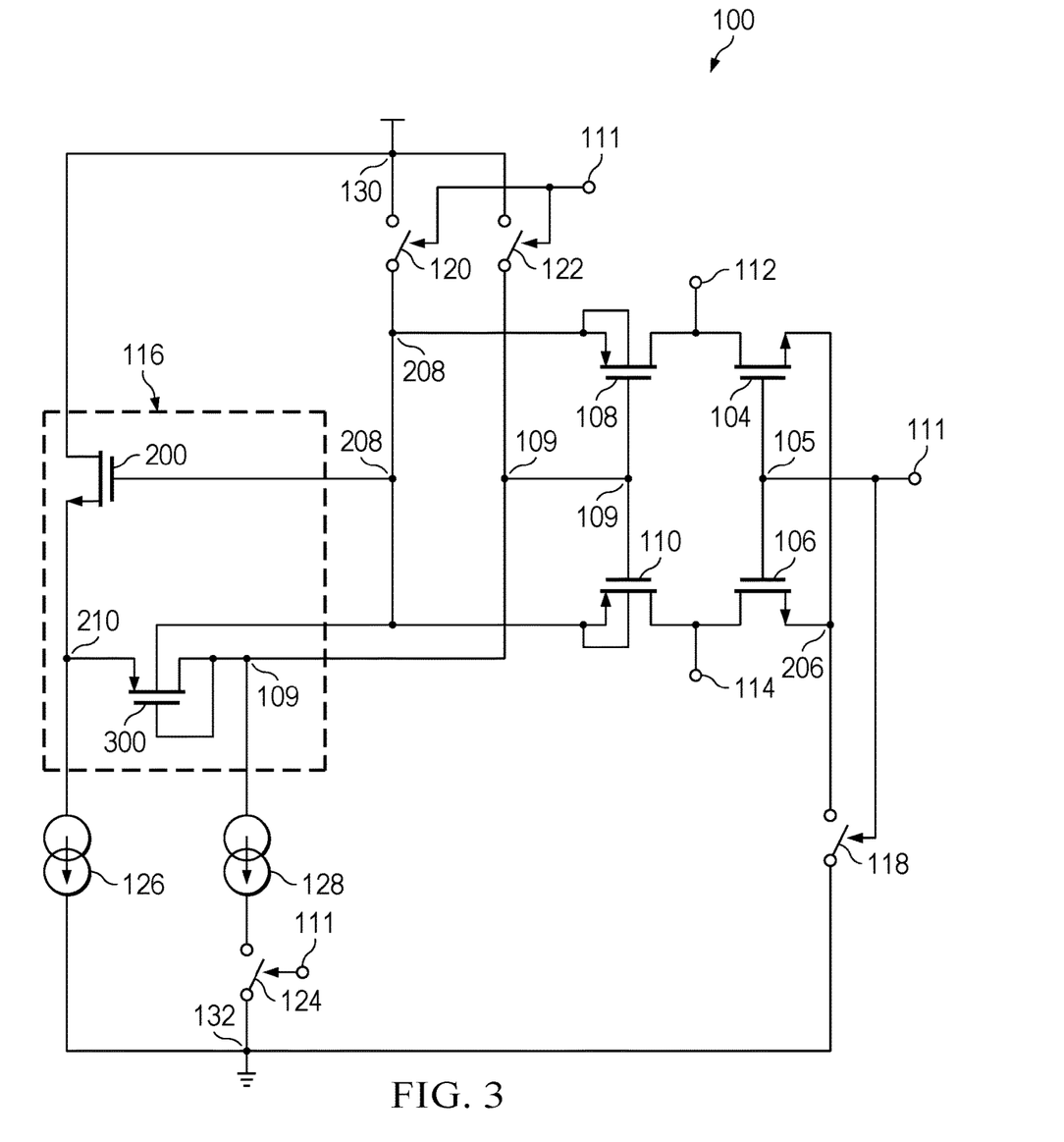
FIG. 3 is a schematic circuit diagram of a switch, in accordance with various examples.
Figure 5:
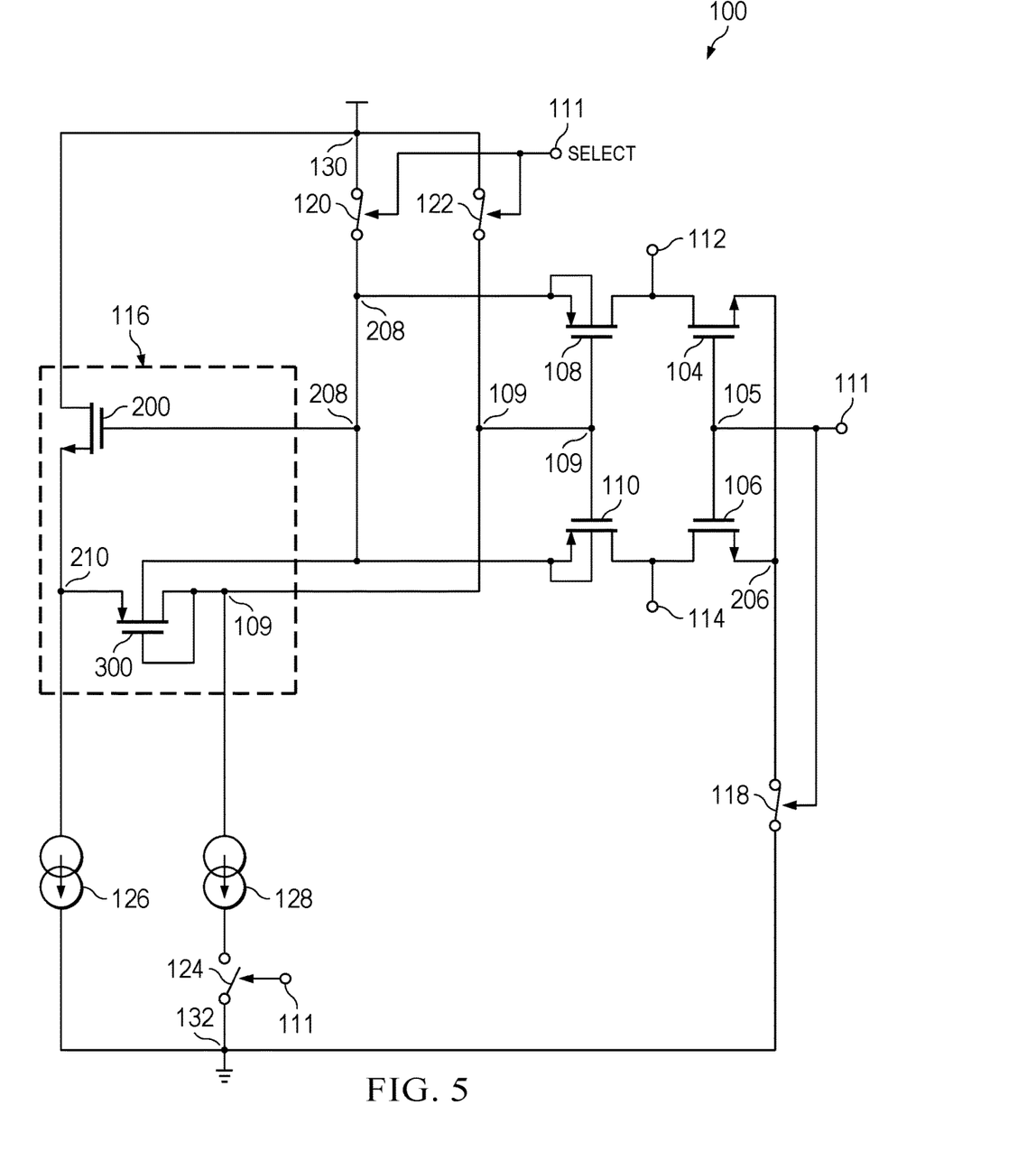
FIG. 5 is a schematic circuit diagram of a switch in an off state, in accordance with various examples.

FIG. 3 is a schematic circuit diagram of the switch 100, in accordance with various examples. The example switch 100 of FIG. 3 is non-limiting and differs from the switch 100 of FIG. 2 by replacing the resistor 202 and the switch 204 with a single transistor 300 (e.g., a p-type FET). The transistor 300 replaces the functionality of the switch 204 because the gate of the transistor 300 is coupled to the drain of the transistor 300, such that the gate and drain voltages are pulled up to the voltage supply 130 when the switch 122 is closed and the switch 100 is off. The voltage at the source of transistor 300 is pulled up to the voltage supply 130 by way of the switch 120, except that it is stepped down by a threshold voltage of the transistor 200. Thus, the source voltage of the transistor 300 is less than the gate voltage of the transistor 300, and so the transistor 300 is off (e.g., open circuit). When the switch 100 is on, the voltage on node 109 is at least a threshold voltage less than the voltage on node 210, and thus the gate to source voltage of transistor 300 is adequately low to cause the transistor 300 to be on. When the switch 100 is on, the transistor 300 behaves as a resistor, e.g., the resistor 202 of FIG. 2. In some examples, the circuit of FIG. 3 may be modified to omit the current source 126 and to couple the source of transistor 200 to the bulk of transistor 200. In some examples, each of the n-type FETs in the circuit of FIG. 3 may be replaced by p-type FETs, and each of the p-type FETs in the circuit of FIG. 3 may be replaced by n-type FETs, such that a source follower-based boost circuit is coupled to the n-type FET pair instead of to the p-type FET pair as is the case in FIG. 3. In yet other examples, a source-follower based-boost circuit such as that coupled to the p-type FET pair in FIG. 3 may be coupled to both the p-type FET pair and the n-type FET pair, with the transistor types in the boost circuit selected as described above (e.g., relative to the source-follower-based boost circuit coupled to the p-type FET pair shown in FIG. 3, the p-type FETs are replaced by n-type FETs and n-type FETs are replaced by p-type FETs in the boost circuit that is coupled to the n-type FET pair). FIG. 5 is a simplified view of the circuit diagram of FIG. 3, with certain open switches shown as open circuits and with certain closed switches shown as closed circuits.

Figure 6:
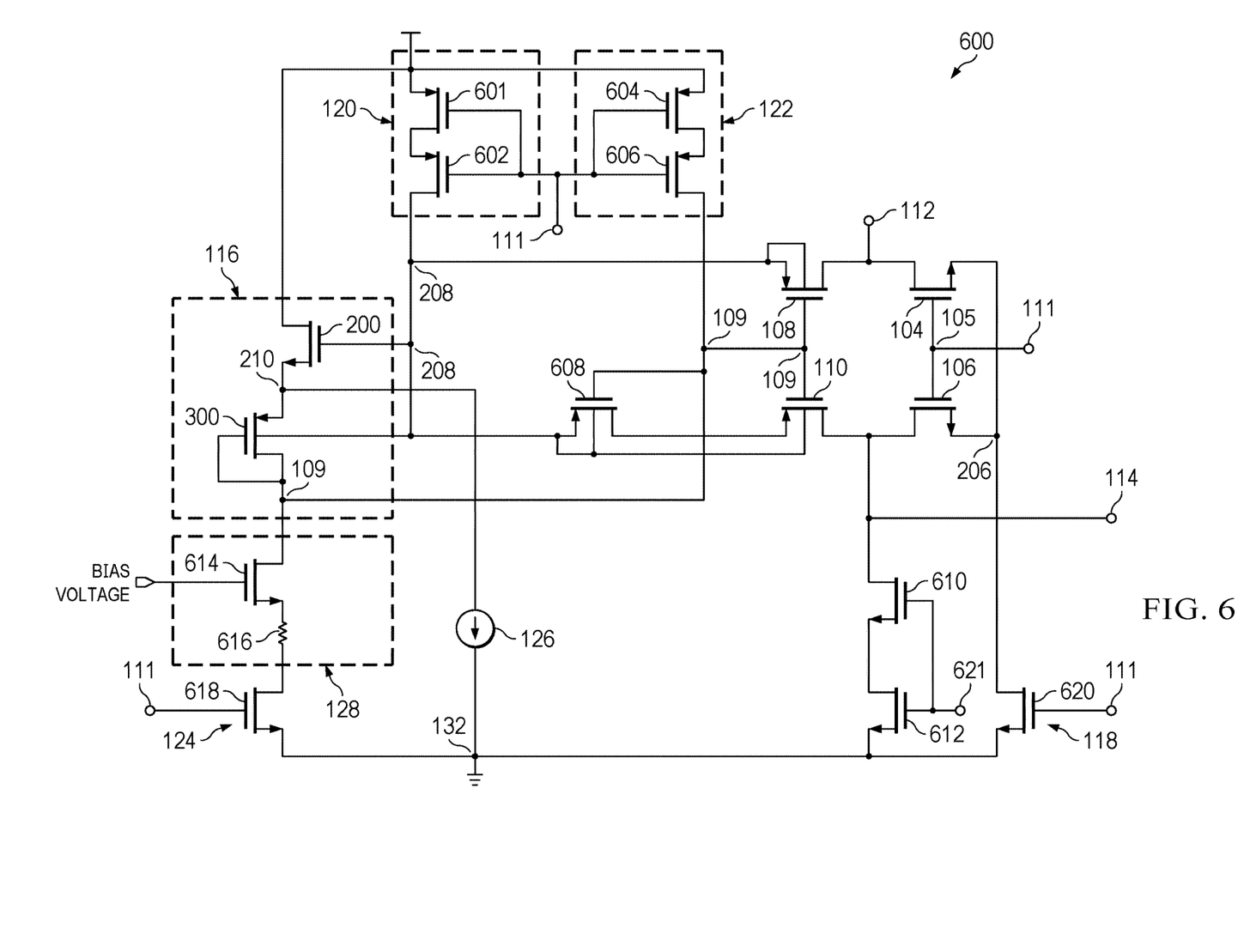
FIG. 6 is a schematic circuit diagram of a switch, in accordance with various examples.

FIG. 6 is a schematic circuit diagram of the switch 100, in accordance with various examples. More specifically, FIG. 6 shows example components (e.g., transistors) that may be used to implement the switches 118, 120, 122, and 124 of FIG. 3 and the bias current source 128 of FIG. 3, as well as various other components that are useful to implement the switch 100. For example, the switch 120 of FIG. 3 may include a pair of transistors 601 and 602. The transistor 601 may be a p-type FET and the transistor 602 may be a p-type drain-extended FET. A source of the transistor 601 is coupled to the voltage supply 130, and a drain of the transistor 601 is coupled to a source of the transistor 602. A drain of the transistor 602 is coupled to node 208. For example, the switch 122 of FIG. 3 may include a pair of transistors 604 and 606. The transistor 604 may be a p-type FET and the transistor 606 may be a p-type drain-extended FET. A source of the transistor 604 is coupled to the voltage supply 130, and a drain of the transistor 604 is coupled to a source of the transistor 606. A drain of the transistor 606 is coupled to node 109. In some examples, only one of the transistors 601, 602 of the switch 120 is included and the other is omitted as it is useful for mitigating current leakage. In some examples, only one of the transistors 604, 606 of the switch 122 is included and the other is omitted as it is useful for mitigating current leakage. In some examples, the drain-extended transistors 602, 606 are included and the non-drain-extended transistors 601, 604 are omitted. Control input 111 is coupled to the gates of the transistors 601, 602, 604, and 606.

In examples, the bias current source 128 includes a transistor 614 coupled to a resistor 616. In examples, the transistor 614 is an n-type drain-extended FET having a source that is coupled to the resistor 616. Together, the transistor 614 and the resistor 616 are sized appropriately to produce a target bias current (e.g., 20 micro amps). In examples, a bias voltage supply is coupled to a gate of the transistor 614 to control the transistor 614, for example, to keep the transistor 614 on.

In examples, the switch 124 includes a transistor 618, such as an n-type FET. The transistor 618 may have a drain coupled to the resistor 616 and a source coupled to ground 132. The gate of the transistor 618 is coupled to control input 111.

In examples, the switch 600 includes a transistor 608, such as a p-type FET having a source coupled to the node 208 and a drain coupled to the source of transistor 110. The gate of the transistor 608 is coupled to the node 109, and the bulk of the transistor 608 is coupled to the source of the transistor 608 and the bulk of the transistor 110. The transistor 608 has a larger threshold voltage than transistor 110, such that the sub-threshold leakage current of the transistor 608 is less than that of transistor 110. Further, the switch output 114 may reach relatively low voltage levels (e.g., 0 V), and transistor 110 is a drain-extended transistor that protects the drain of transistor 608, which may not be able to tolerate 3.3 V. Accordingly, the transistor 608 is able to mitigate leakage current.

In examples, the switch 600 includes a transistor 610, such as an n-type drain-extended FET having a drain coupled to switch output 114. The switch 600 also includes a transistor 612, such as an n-type FET having a drain coupled to a source of the transistor 610 and a source coupled to ground 132. The transistors 610, 612 mitigate leakage current and may be controlled by any suitable circuitry or logic 621. Specifically, the transistor 612 has a larger threshold voltage than transistor 610, such that the sub-threshold leakage current of the transistor 612 is less than that of transistor 610. In addition, the switch output 114 may reach relatively high voltage levels (e.g., 3.3 V), and transistor 610 is a drain-extended transistor that protects the drain of transistor 612, which may not be able to tolerate 3.3 V.

The switch 118 includes a transistor 620, such as an n-type drain-extended FET. The transistor 620 includes a drain coupled to the node 206 and a source coupled to ground 132.

Figure 7:
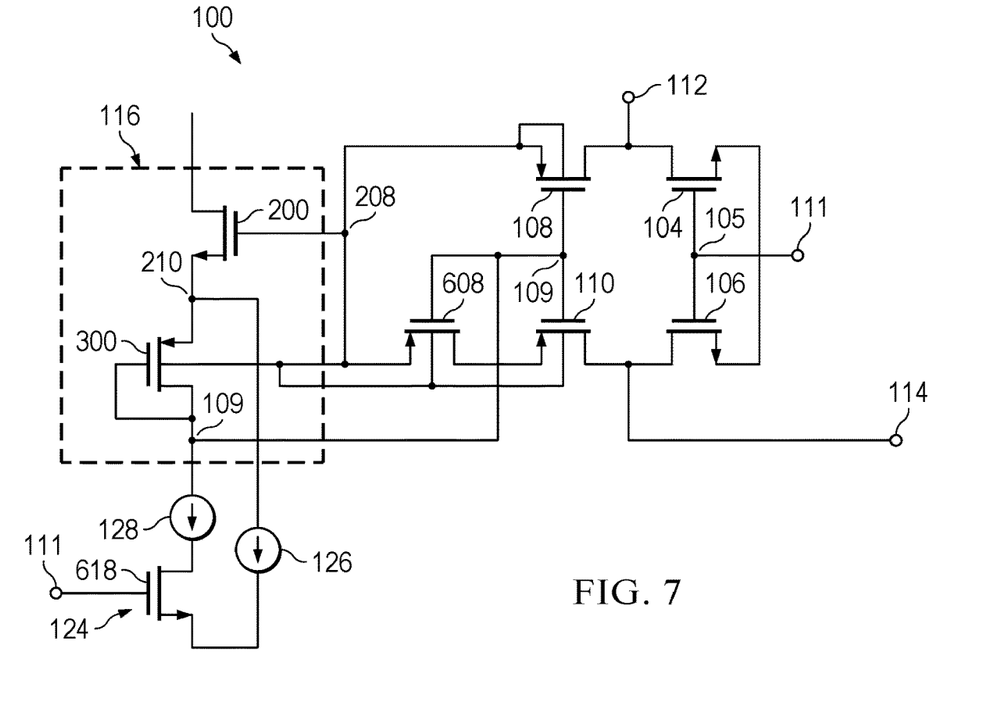
FIG. 7 is a schematic circuit diagram of a switch in an on state, in accordance with various examples.
Figure 8:
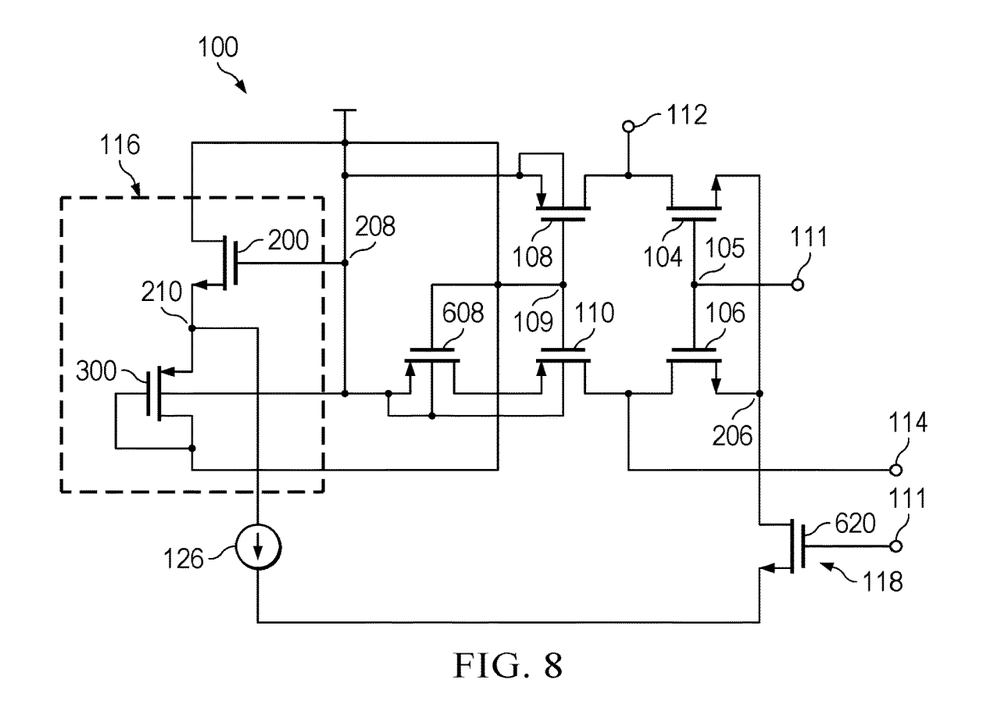
FIG. 8 is a schematic circuit diagram of a switch in an off state, in accordance with various examples.

The operation of the switch 100 as shown in FIG. 6 is similar to that described above with reference to FIGS. 1-5. Thus, the operation of the switch 100 is not repeated here. FIG. 7 is a schematic circuit diagram of the example switch 100 of FIG. 6 in an on state, in accordance with various examples. FIG. 8 is a schematic circuit diagram of the example switch 100 of FIG. 6 in an off state, in accordance with various examples.

Figure 9:
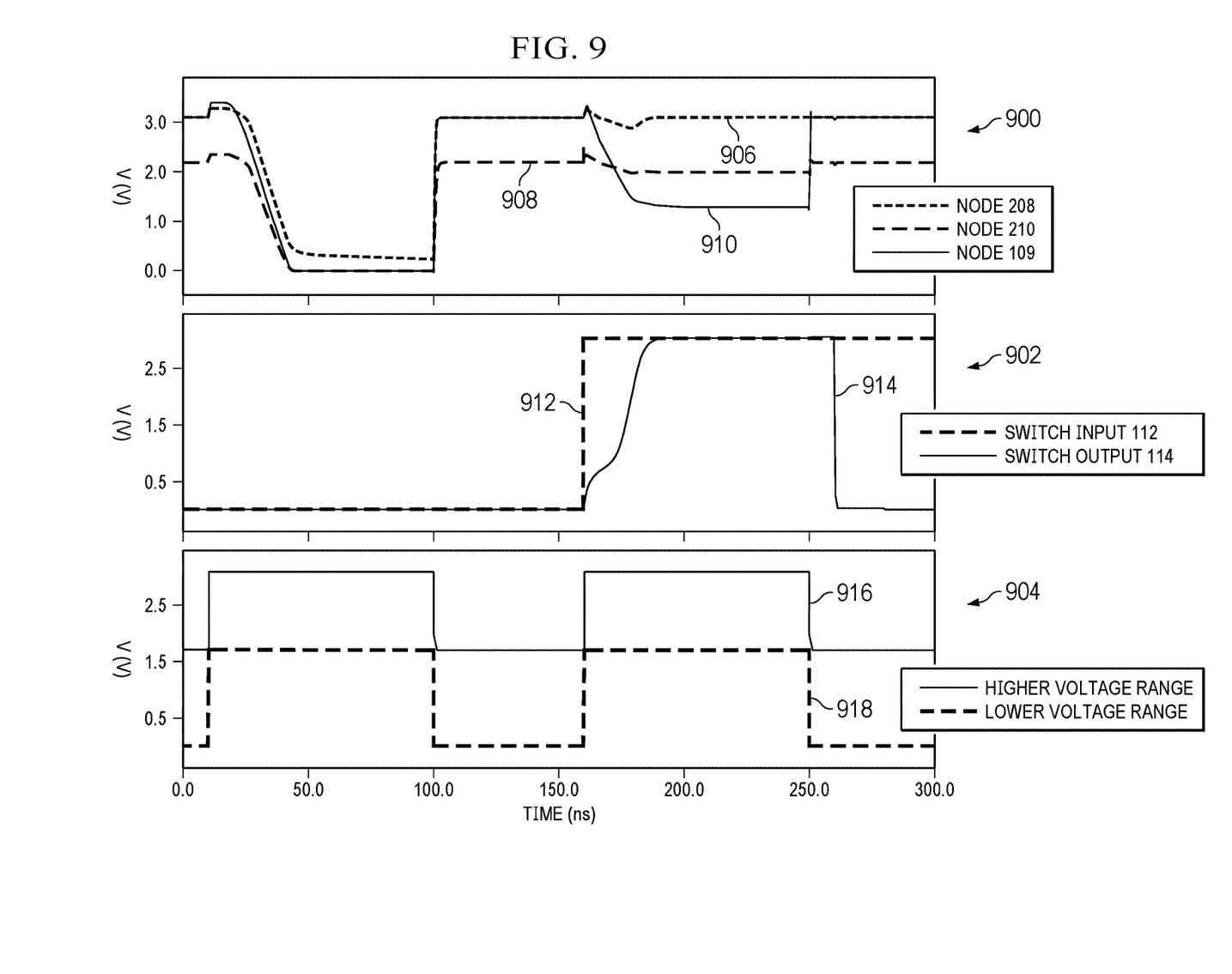
FIG. 9 is a set of graphs depicting voltages at various nodes in a switch as a function of time, in accordance with various examples.

FIG. 9 is a set of graphs 900, 902, and 904 depicting voltages at various nodes in an example switch 100 as a function of time, in accordance with various examples. Each of the graphs 900, 902, and 904 includes time (in nanoseconds (ns)) on the x-axis and voltage on the y-axis. Graph 900 includes curves 906, 908, and 910, where curve 906 depicts the voltage over time on the node 208, curve 908 depicts the voltage over time on the node 210, and curve 910 depicts the voltage over time on the node 109. In graph 902, curve 912 depicts the voltage over time on the switch input 112, and curve 914 depicts the voltage over time on the switch output 114. In graph 904, both of the curves 916 and 918 depict the voltage over time for control input 111 as the control input 111 is applied to various transistors in the switch 100. As curves 916 and 918 depict, in some examples, the control input 111 may be implemented using different voltage ranges. For example, although the control input 111 may be high, different voltages may be used to implement a high signal, such as 3.3 V (curve 916) and 1.7 V (curve 918). Conversely, although the control input 111 may be low, different voltages may be used to implement a low signal on different transistors, such as 1.7 V (curve 916) and 0 V (curve 918).

The behavior of the curves is now described. Curves 916 and 918 depict the turning on and off of the switch 100. Curves 916 and 918 behave in parallel, meaning that both curves 916 and 918 are high at the same time and are low at the same time. Curves 916 and 918 depict the switch 100 being off from 0 ns to 10 ns, on from 10 ns to 100 ns, off from 100 ns to 160 ns, on from 160 ns to 250 ns, and off from 250 ns to 300 ns. As curve 914 shows when compared to curves 916 and 918, whenever the switch 100 is off, the output voltage on switch output 114 is 0 V. As the time frame 10 ns to 100 ns shows, even when the switch 100 is on (as curves 916 and 918 depict), the output voltage on switch output 114 (curve 914) remains 0 V because the input voltage on switch input 112 (curve 912) is 0 V. The only time period depicted in FIG. 9 during which the output voltage (curve 914) rises above 0 V is when the switch 100 is on (curves 916 and 918) and the input voltage is high (curve 912), except that the output voltage (curve 914) remains high for a short time (approximately 10 nanoseconds) after the switch 100 (curves 916 and 918) is turned off. Specifically, when the switch 100 turns off at 250 ns, the output node of the switch 100 is in a high impedance state in which the output voltage is held by the residual capacitance of the output node. This time period is 160 ns to 260 ns.

Curves 906, 908, and 910 depict the behavior of voltages that are useful to achieve the output voltage curve 914. As the switch 100 is turned on, the switches 120 and 122 are opened, and thus the voltages on nodes 208 (curve 906) and 109 (curve 910) begin to fall in the 10 ns to 45 ns time frame. Because the voltage on node 210 relies on the voltage on nodes 208 and 109, the curve 908 also follows curves 906 and 910, as shown. While the switch 100 is on and no input voltage is provided to the switch 100, the output voltage of the switch 100 remains low (curve 914) and the voltages on the nodes 208, 109, and 210 also remain low (curves 906, 908, and 910 from approximately 45 ns to 100 ns). When the switch 100 is turned off at 100 ns, the switches 120, 122 are closed, and the nodes 208, 109, and 210 are pulled up to the voltage supply 130, as curves 906, 908, and 910 show at 100 ns. While the switch 100 remains off, the curves 906, 908, and 910 remain high, as the time frame 100 ns-160 ns shows. At 160 ns, the switch 100 is turned on (curves 916, 918) and a high input voltage (curve 912) is provided to the switch 100. Consequently, the switches 120, 122 open, and thus the nodes 208, 109, and 210 are no longer pulled up to the voltage supply 130. However, the voltages on nodes 208, 109, and 210 do not drop as low as they did in the 10 ns to 45 ns time frame. Instead, they drop only slightly, as they are now pulled up by the input voltage to the switch 100 at switch input 112. Curves 906 and 908 show this behavior. Curve 910 decreases lower than curves 906 and 908, because the voltage on node 109 (curve 910) is stepped down by the transistors 200, 300 as described above. As the difference between the curves 906, 910 increases, the transistors 108, 110 turn on, and the output voltage provided on the switch output 114 (curve 914) increases, as shown. The operation shown in FIG. 9 is primarily dependent on the transistors 108, 110 to provide a pathway from the switch input 112 to the switch output 114, because the input voltage on switch input 112 is relatively high (approximately 3.3 V). Had the input voltage been in a lower range (e.g., 0.3 V), the transistors 104, 106 may have been turned on and provided a pathway between the switch input 112 and the switch output 114, as described in detail above.

Figure 10:
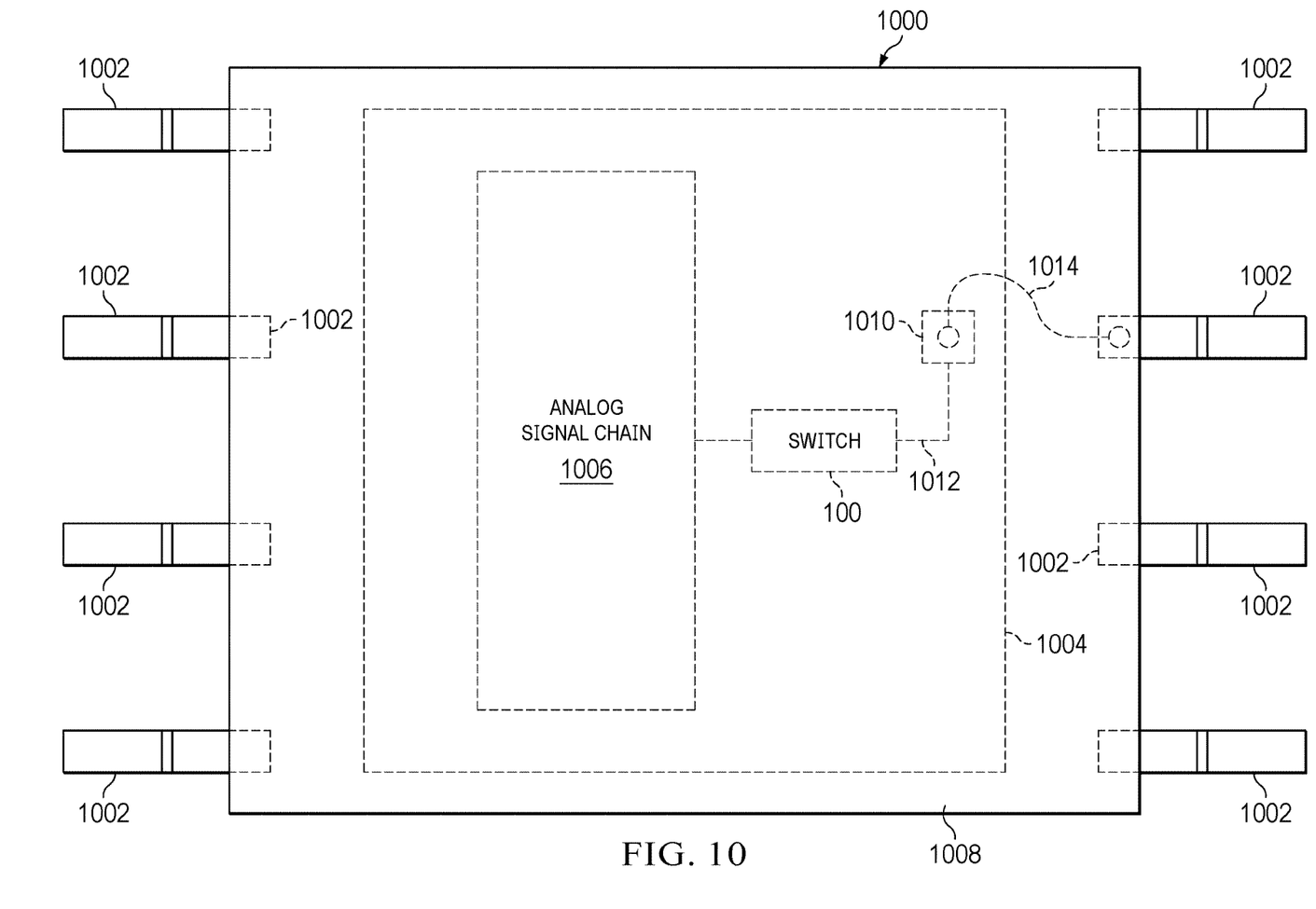
FIG. 10 is a block diagram of a semiconductor package covering a system-on-chip (SOC) having an analog signal chain coupled to a switch, in accordance with various examples.

FIG. 10 is a block diagram of a semiconductor package 1000 covering a system-on-chip (SOC) having an analog signal chain coupled to a switch, in accordance with various examples. FIG. 10 is a top-down view of the package 1000. FIG. 10 shows semiconductor package 1000 as a dual-inline, gullwing style package, but the scope of disclosure includes any suitable type of package, such as ball grid array (BGA) packages, quad flat no lead (QFN) packages, etc. In examples, the package 1000 includes a die (or chip) 1004. The die 1004 may be coupled to a die pad using a die attach material, for example. The die 1004 includes circuitry formed in and on an active surface of the die 1004, such as an analog signal chain 1006. The analog signal chain 1006 includes various analog circuits that are configured to perform one or more tasks. The analog signal chain 1006 is coupled to a switch 100. For example, the switch 100 is any example of the switch 100 described herein. The analog signal chain 1006 is coupled to a bond pad 1010 by way of a conductive member 1012, such as a metal trace, via the switch 100. A bond wire 1014 is coupled to the bond pad 1010 (e.g., by way of a solder ball) and to a pin 1002. The pin 1002 is exposed to an exterior of the package 1000 and may be useful to conduct signals to and from the die 1004. A mold compound 1008 covers the die 1004, the contents of the die 1004, and the bond wire 1014.

The term "couple" is used throughout the specification. The term may cover connections, communications, or signal paths that enable a functional relationship consistent with this description. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While certain components may be described herein as being of a particular process technology, these components may be exchanged for components of other process technologies. Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the terms "ground" or "ground voltage potential" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means+/−10 percent of the stated value. Modifications are possible in the described examples, and other examples are possible within the scope of the claims.

What is claimed is:

1. A switch, comprising:
   first and second drain-extended transistors of a first type;
   third and fourth drain-extended transistors of a second type;
   a switch input coupled between drains of the first and third drain-extended transistors;
   a switch output coupled between drains of the second and fourth drain-extended transistors;
   a control input coupled to:
      gates of the first and second drain-extended transistors;
      a first switch coupled to sources of the first and second drain-extended transistors;
      a second switch coupled between a voltage supply and gates of the third and fourth drain-extended transistors; and
      a third switch coupled between the voltage supply and sources of the third and fourth drain-extended transistors; and
   a fifth drain-extended transistor coupled between the sources of the third and fourth drain-extended transistors and the gates of the third and fourth drain-extended transistors.

2. The switch of claim 1, wherein the first type includes n-type field effect transistors (FETs).

3. The switch of claim 1, wherein the second type includes p-type FETs.

4. The switch of claim 1, wherein the fifth drain-extended transistor is an n-type FET.

5. The switch of claim 1, further comprising a transistor coupled to a source of the fifth drain-extended transistor and to the gates of the third and fourth drain-extended transistors.

6. The switch of claim 5, further comprising a bias current source coupled to a source of the fifth drain-extended transistor and to a source of the transistor.

7. The switch of claim 5, further comprising a bias current source coupled to a drain of the transistor and to the gates of the third and fourth drain-extended transistors.

8. The switch of claim 1, wherein the first switch includes a first pair of p-type FETs and the second switch includes a second pair of p-type FETs.

9. The switch of claim 1, wherein the fifth drain-extended transistor includes a gate coupled to the sources of the third and fourth drain-extended transistors, a drain coupled to the voltage supply, and a source coupled to a bias current source.

10. A switch, comprising:
a switch input;
a switch output;
a first pair of drain-extended transistors coupled to the switch input and the switch output, the first pair of drain-extended transistors configured to provide a voltage from the switch input to the switch output responsive to the switch being on and the voltage being in a first range;
a second pair of drain-extended transistors coupled to the switch input and the switch output, the second pair of drain-extended transistors configured to provide a voltage from the switch input to the switch output responsive to the switch being on and the voltage being in a second range different from the first range; and
a transistor coupled between sources and gates of the second pair of drain-extended transistors, the transistor configured to provide a gate voltage on the gates of the second pair of drain-extended transistors that is a fixed amount less than a voltage on the switch input.

11. The switch of claim 10, wherein the first pair of drain-extended transistors includes first and second n-type field effect transistors (FETs), a drain of the first n-type FET coupled to the switch input and a drain of the second n-type FET coupled to the switch output.

12. The switch of claim 10, wherein the second pair of drain-extended transistors includes first and second p-type FETs, a drain of the first p-type FET coupled to the switch input and a drain of the second p-type FET coupled to the switch output.

13. The switch of claim 10, wherein a gate of the transistor is coupled to the sources of the second pair of drain-extended transistors, a drain of the transistor is coupled to a voltage supply, and a source of the transistor is coupled to a bias current source.

14. The switch of claim 10, wherein the transistor is a first transistor, and further comprising a second transistor coupled between the first transistor and the gates of the second pair of drain-extended transistors.

15. The switch of claim 14, further comprising a bias current source coupled to the second transistor.

16. The switch of claim 10, wherein the transistor is a drain-extended n-type FET.

17. A system-on-chip (SOC), comprising:
an input analog signal chain; and
a switch coupled to the input analog signal chain and adapted to be coupled to a package pin, the switch including:
a switch input;
a switch output;
a first pair of drain-extended transistors having drains coupled to the switch input and the switch output;
a second pair of drain-extended transistors having drains coupled to the switch input and the switch output; and
a first switch coupled to sources of the first pair of drain-extended transistors;
a second switch coupled between a voltage supply and gates of the second pair of drain-extended transistors;
a third switch coupled between the voltage supply and sources of the second pair of drain-extended transistors; and
a transistor coupled between the sources and the gates of the second pair of drain-extended transistors, a gate of the transistor coupled to the third switch and to the sources of the second pair of drain-extended transistors.

18. The SOC of claim 17, wherein the transistor is a p-type drain-extended field effect transistor (FET) having a gate coupled to the sources of the second pair of drain-extended transistors, a drain coupled to a voltage supply, and a source coupled to a bias current source.

19. The SOC of claim 17, wherein each of the second and third switches includes a different pair of FETs, each pair of FETs including a different drain-extended FET.

20. The SOC of claim 17, wherein the first switch is a drain-extended FET.

* * * * *